(12) United States Patent
Hirao et al.

(10) Patent No.: US 7,499,298 B2
(45) Date of Patent: Mar. 3, 2009

(54) SEMICONDUCTOR INTEGRATED CIRCUIT AND CONTROLLING METHOD THEREOF

(75) Inventors: Yasuzumi Hirao, Kawasaki (JP); Masaru Numano, Kawaguchi (JP)

(73) Assignee: Kabushik Kaisha Toshiba, Tokyo (JP)

( * ) Notice: Subject to any disclaimer, the term of this patent is extended or adjusted under 35 U.S.C. 154(b) by 230 days.

(21) Appl. No.: 11/447,010

(22) Filed: Jun. 6, 2006

(65) Prior Publication Data
US 2006/0273801 A1 Dec. 7, 2006

(30) Foreign Application Priority Data
Jun. 6, 2005 (JP) ............................. 2005-165561

(51) Int. Cl.
*H02M 7/00* (2006.01)
(52) U.S. Cl. ....................................... 363/73
(58) Field of Classification Search .................. 363/50, 363/73, 74; 323/311, 312
See application file for complete search history.

(56) References Cited

U.S. PATENT DOCUMENTS

2003/0012040 A1 * 1/2003 Orita et al. .................... 363/73

OTHER PUBLICATIONS

Paul R. Gray, et al., "Analysis and Design of Analog Integrated Circuits", pp. 584-591.

* cited by examiner

*Primary Examiner*—Adolf Berhane
(74) *Attorney, Agent, or Firm*—Oblon, Spivak, McClelland, Maier & Neustadt, P.C.

(57) ABSTRACT

A semiconductor integrated circuit includes: a power supply circuit; a voltage-current conversion circuit connected with an output of the power supply circuit, the voltage-current conversion circuit having an output terminal; a current-voltage conversion circuit connected with the output terminal of the voltage-current conversion circuit, the current-voltage conversion circuit having an output terminal; a constant-voltage line connected with the output terminal of the current-voltage conversion circuit; an output circuit which has an output terminal to which an external element is connected at a rear stage thereof; and a protection circuit which receives a potential of the constant-voltage line and the output signal from the power supply circuit to control a potential of the output terminal, and prevents the external element from operating when an increase in the potential of the constant-voltage line is insufficient or the power supply voltage is not in a steady state.

15 Claims, 5 Drawing Sheets

SEMICONDUCTOR INTEGRATED CIRCUIT AND CONTROLLING METHOD THEREOF

BACKGROUND OF THE INVENTION

1. Cross Reference to Related Application

This application claims benefit of priority under 35USC §119 to Japanese Patent Application No. 2005-165561, filed on Jun. 6, 2005, the contents of which are incorporate by reference herein.

2. Field of the Invention

The present invention relates to a semiconductor integrated circuit and a controlling method thereof.

3. Related Background Art

A semiconductor integrated circuit used for, e.g., driving an element conventionally has a power supply circuit, a transistor, a current-voltage converter such as a resistor, an NPN transistor, a small-signal circuit and an output circuit. The power supply circuit enters a steady state when an external supply power Vcc is not smaller than a voltage Vccth. The transistor receives an output from the power supply circuit and converts it into a current. The current-voltage, converter receives a current from the transistor and converts it into a voltage. The NPN transistor receives an output from the current-voltage converter and fixes a potential of a constant-voltage line. A voltage is applied to the small-signal circuit through this constant-voltage line as a voltage supply line. The output circuit is connected with a rear stage of the small-signal circuit. An output terminal of this output circuit drives a power element connected with this terminal.

Japanese patent laid open (kokai) 2004-056914 discloses a driving apparatus which can avoid an increase in consumption current due to a rise of a temperature of a piezoelectric element and prevent breakdown of the element or an increase in size of a power supply. This apparatus is characterized in that a supply current stabilizing circuit section comprising a current-limit circuit section and a capacitor is provided between the power supply and a driving circuit section.

SUMMARY OF THE INVENTION

According to a first aspect of the present invention, there is provided a semiconductor integrated circuit comprising: a power supply circuit; a voltage-current conversion circuit connected with an output of the power supply circuit, the voltage-current conversion circuit having an output terminal; a current-voltage conversion circuit connected with the output terminal of the voltage-current conversion circuit, the current-voltage conversion circuit having an output terminal; a constant-voltage line connected with the output terminal of the current-voltage conversion circuit; an output circuit which has an output terminal to which an external element is connected at a rear stage thereof; and a protection circuit which receives a potential of the constant-voltage line and the output signal from the power supply circuit to control a potential of the output terminal, and prevents the external element from operating when an increase in the potential of the constant-voltage line is insufficient or the power supply voltage is not in a steady state.

According to a second aspect of the present invention, there is provided a controlling method of a semiconductor integrated circuit comprising a power supply circuit, a voltage-current conversion circuit, a current-voltage conversion circuit, a constant-voltage line and an output circuit, the method comprising: inputting an output of the power supply circuit with the voltage-current conversion circuit, the voltage-current conversion circuit having an output terminal; connecting the current-voltage conversion circuit with the output terminal of the voltage-current conversion circuit, the current-voltage conversion circuit having an output terminal; connecting the constant-voltage line with the output terminal of the current-voltage conversion circuit; and detecting a potential of the constant-voltage line and the output signal from the power supply circuit and controlling a potential of the output terminal of the output circuit to prevent an external element connected at a rear stage of the output circuit from operating when an increase in the potential of the constant-voltage line is insufficient for a normal operation of the external element or the power supply voltage is not in a steady state.

DETAILED DESCRIPTION OF THE INVENTION

Some of embodiments according to the present invention will now be described hereinafter with reference to the accompanying drawings.

First Embodiment

A description will be first given as to a first embodiment according to the present invention with reference to FIG. 1 and FIGS. 7A-7D.

Figure 1:
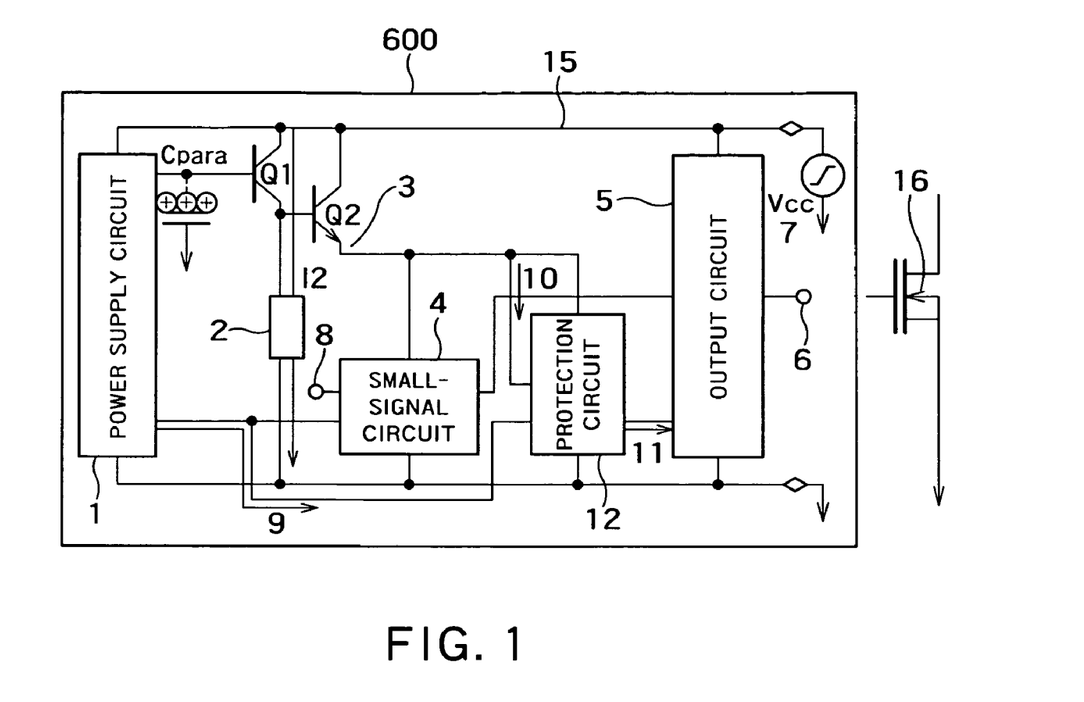
FIG. 1 is a circuit diagram showing a semiconductor integrated circuit according to a first embodiment of the present invention.
Figure 7A:
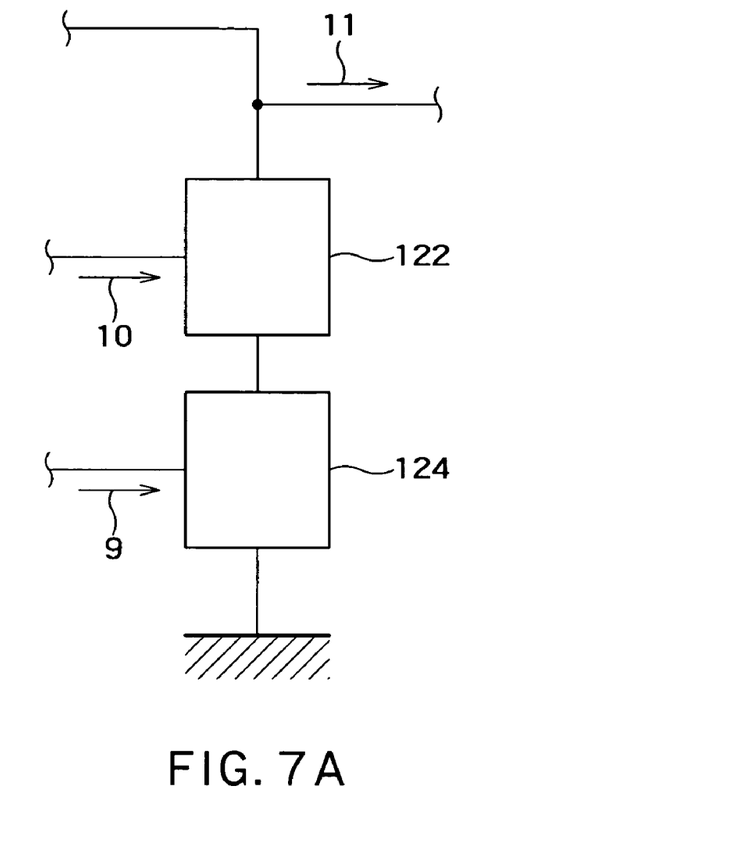
FIGS. 7A and 7D are circuit diagrams showing examples of a protection circuit used in the semiconductor integrated circuit in each of FIGS. 1 to 6.
Figure 7B:
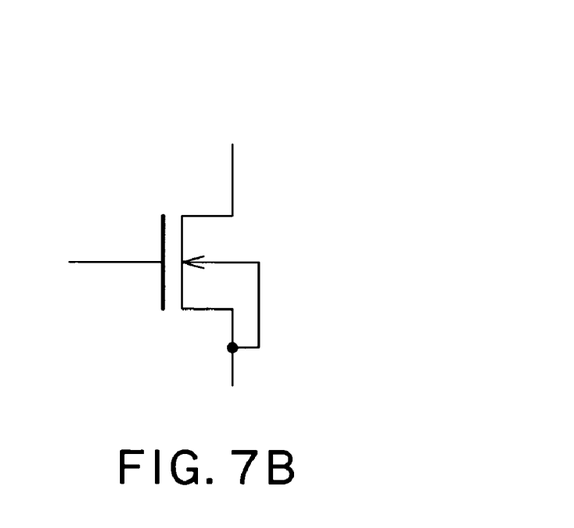
FIGS. 7B and 7C are circuit diagrams showing examples of a transistor used in the protection circuit in each of FIGS. 7A and 7D.
Figure 7C:
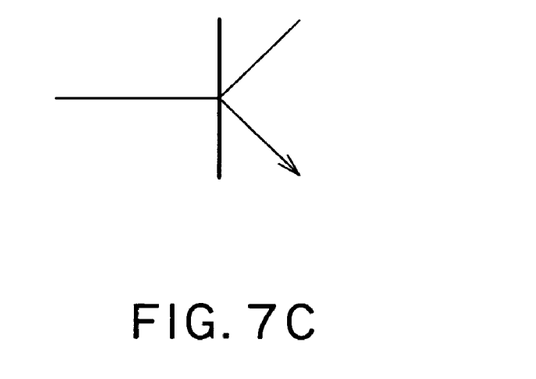
Figure 7D:
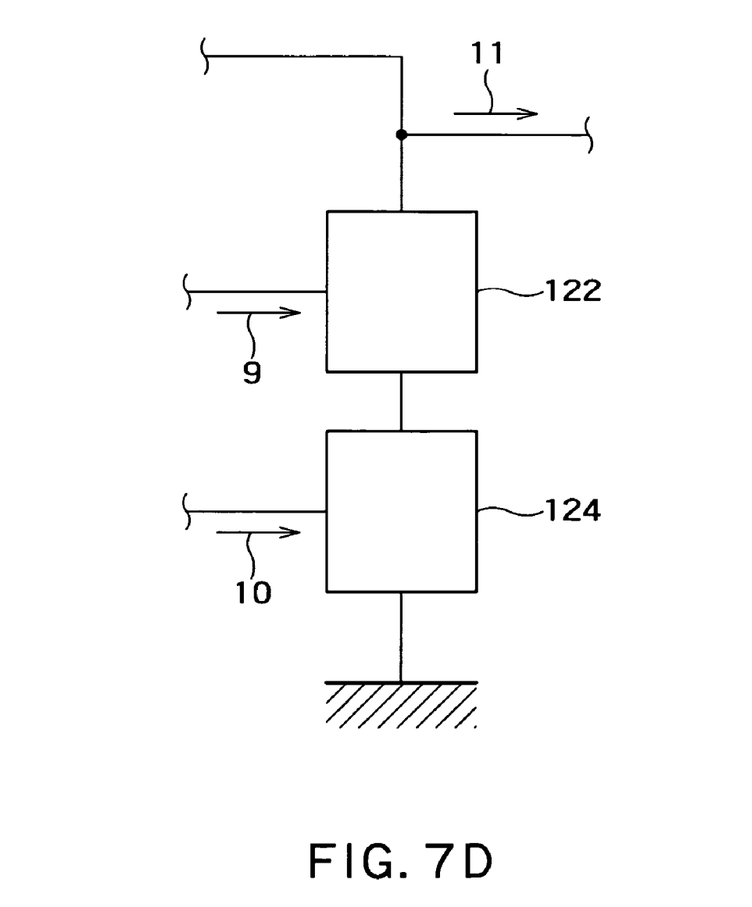

FIG. 1 is a circuit diagram of a semiconductor integrated circuit 600 according to this embodiment, and this circuit is used as, for example, a driving IC which drives a power element 16. FIGS. 7A and 7D show examples of a protection circuit used in the semiconductor integrated circuit 600.

The semiconductor integrated circuit 600 according to this embodiment has a power supply circuit 1, a transistor Q1, a current-voltage converter 2, a constant-voltage line 3, an NPN transistor Q2, an output circuit 5 having an output terminal 6, and a protection circuit 12.

The power supply circuit 1 enters a steady state when an external supply power Vcc7 is not smaller than a voltage Vccth. The transistor Q1 constitutes a voltage-current conversion circuit which receives an output from the power supply circuit 1 and converts it into a current. The current-voltage converter 2 is constituted of, e.g., a resistor, receives a current from the transistor Q1 and converts it into a voltage. The constant-voltage line 3 is connected with an output terminal of the current-voltage converter 2. The NPN transistor Q2 is connected between the transistor Q1 and the constant-voltage line 3, receives an output from the current-voltage conversion circuit 2 and fixes a potential of the constant-voltage line 3. The protection circuit 12 receives the potential of the constant-voltage line 3 and an output signal 9 from the power supply circuit 1. Thus, the protection circuit 12 controls a potential of the output terminal 6 and prohibits an element 16 connected with a rear stage of the output terminal 6 from operating when an increase in potential of the constant-voltage line 3 is insufficient or the power supply circuit 1 is not in the steady state.

The external supply power Vcc7 is supplied to the power supply circuit 1 through a power supply line 15. In this embodiment, an LPNP transistor is used as the transistor Q1, a base thereof is connected with the power supply circuit 1, an emitter thereof is connected with the power supply line 15 and a collector thereof is connected with the current-voltage converter 2. The transistor Q2 has a base connected with the collector of the transistor Q1, an emitter connected with the constant-voltage line 3 and a collector connected with the power supply line 15. A small-signal circuit 4 is connected with the constant-voltage line 3, and the output circuit is connected with a rear stage of the small-signal circuit 4 so that a voltage from the small-signal circuit 4 is supplied to the output circuit 5. An output from the power supply circuit 1 is usually inputted to this small-signal circuit 4, and the small-signal circuit 4 does not normally operate unless a signal from the power supply circuit 1 is inputted thereto. An output of the output circuit 5 is connected with the output terminal 6.

This semiconductor integrated circuit 600 is provided with the protection circuit 12 to which the output signal 9 from the power supply circuit 1 and a monitor signal 10 from the constant-voltage line 3 are inputted. An output signal 11 of the protection circuit 12 is inputted to the output circuit 5.

Further, when the semiconductor integrated circuit 600 according to this embodiment is used as a driving IC, a rear stage of the output terminal 6 is connected with a power element 16 or the like which is a driven element. The protection circuit 12 is a circuit which controls an output from the output circuit 5 by receiving a signal which operates this semiconductor integrated circuit 600. The protection circuit 12 is constituted of, e.g., elements 122 and 124 which are connected in series. The monitor signal 10 from the constant-voltage line 3 is inputted to the element 122, for example. The output signal 9 from the power supply circuit 1 is inputted to the element 124, for example. More specifically, the elements 122 and 124 are constituted by an NchMOS transistor shown in FIG. 7B or an NPN transistor shown in FIGS. 7C. Moreover, as are shown in FIG. 7D, the monitor signal 10 from the constant-voltage line 3 may be inputted to the element 122 and the output signal 9 from the power supply circuit 1 may be inputted to the element 124.

When the power supply circuit 1 is not started up yet, the output signal 9 of the power supply circuit 1 is L while an output signal 11 of the protection circuit 12 is H, and the output terminal 6 of the output circuit 5 does not perform output. On the other hand, when the power supply circuit 1 is stably operating, the output signal 9 of the power supply circuit 1 is H whilst the output signal 11 of the protection circuit 12 is L, and hence the output terminal of the output circuit 5 performs output.

The protection circuit 12 is a circuit which receives the output signal 9 of the power supply circuit 1 and the monitor signal 10 of the constant-voltage line 3 and changes the output signal 11 depending on states of these two input signals.

Furthermore, the output signal 11 of the protection circuit 12 is an input signal of the output circuit 5, and control of outputting/not outputting an output potential from the output terminal 6 is executed based on this signal.

The output signal 9 of the power supply circuit 1 is a signal indicating that the power supply circuit 1 has entered the steady state. The monitor signal 10 of the constant-voltage line 3 is a signal indicating that a potential of the constant-voltage line 3 has been increased. The protection circuit 12 outputs a control signal which fixes a potential of the output terminal 6 in such a manner that the power element 16 on the rear stage of the output terminal 6 of the output circuit 5 is prevented from erroneously operating until the power supply circuit 1 enters the steady state and a potential of the constant-voltage line 3 is increased and inputted as a voltage signal V3th which is at least sufficient for a stable operation of the small-signal circuit 4. On the contrary, when the power supply circuit 1 enters the steady state and a potential of the constant-voltage line 3 is increased to become not smaller than V3th, a signal is outputted from the output terminal 6 in accordance with an input signal of an input terminal 8.

As a result, when the supply voltage Vcc7 is precipitously increased and not greater than Vccth (when the power supply circuit 1 is in an unoperated state), an output potential is not outputted from the output terminal by a function of the protection circuit 12, thereby avoiding erroneous operation output. Furthermore, when the power supply circuit 1 enters the steady state and a potential of the constant-voltage line 3 is increased to become not smaller than V3th, the output circuit 5 can be set in a regular operating state.

According to the conventional semiconductor integrated circuit mentioned above, when the output of the supply power Vcc is gradually increased from 0 V and the output of the supply power Vcc exceeds a threshold voltage Vccth of the supply power Vcc with which the power supply circuit enters the steady state, the power supply circuit is stabilized, and the transistor Q1 (refer to FIG. 2), the current-voltage converter and the transistor Q2 (refer to FIG. 3) start to operate, thereby setting a fixed potential of the constant-voltage line. Then, the small-signal circuit starts its operation and is stabilized, and the output circuit starts its operation and is stabilized at last. Specifically, the power supply circuit, the constant-voltage line, the small-signal circuit and the output circuit start operations in the mentioned order, and a potential of an output terminal of a driving IC is fixed at last. The potential of the output terminal must not exceed a threshold voltage of the power element, e.g., 5V for a power MOS transistor until the potential is fixed. When the potential exceeds this value, the power MOS transistor and other components provided at the rear stage thereof may be destroyed in some cases.

However, when the supply power Vcc is precipitously increased from 0 V, the operation starting order comes apart, and the output terminal of the driving IC may be possibly set to Vth or above. This point will now be described in more detail.

The parasitic capacitance exists at the output line of the power supply circuit or the base terminal of the transistor Q1, and a displacement current I1 (refer to FIG. 1) flows due to a change in the supply power Vcc. When the transistor Q1 is an LPNP transistor, the displacement current I1 is multiplied by hFE to become a displacement current I2 (refer to FIG. 1), and flows into the current-voltage converter. Further, a potential of the constant-voltage line is finally increased. At this time, when the supply power Vcc is not greater than Vccth, the power supply circuit is not operating, and hence a signal reaching the small-signal circuit does not stabilize the small-signal circuit. However, when the potential of the constant-voltage line is increased to some extent or more, e.g., $V_{BE}$ or Vth or above, each node in the small-signal circuit has a given potential, and an output of the small-signal circuit likewise has a given potential. If this potential is an output from the output circuit, i.e., a signal which sets a potential of the output terminal of the driving IC to Vth or above, the power supply circuit and the small-signal circuit are not stabilized yet, and hence this state is an erroneous operation. Furthermore, the power element and other components at the rear stage thereof may be destroyed depending on a bias state of the power element on the rear stage.

On the other hand, in the present embodiment, when the supply voltage is precipitously increased and the power supply circuit is in an unoperated state, an output potential is not outputted from the output terminal by a function of the protection circuit, thereby avoiding erroneous operation output. As a result, such a problem is hard to occur.

Second Embodiment

A second embodiment according to the present invention will now be described with reference to FIG. 2.

Figure 2:
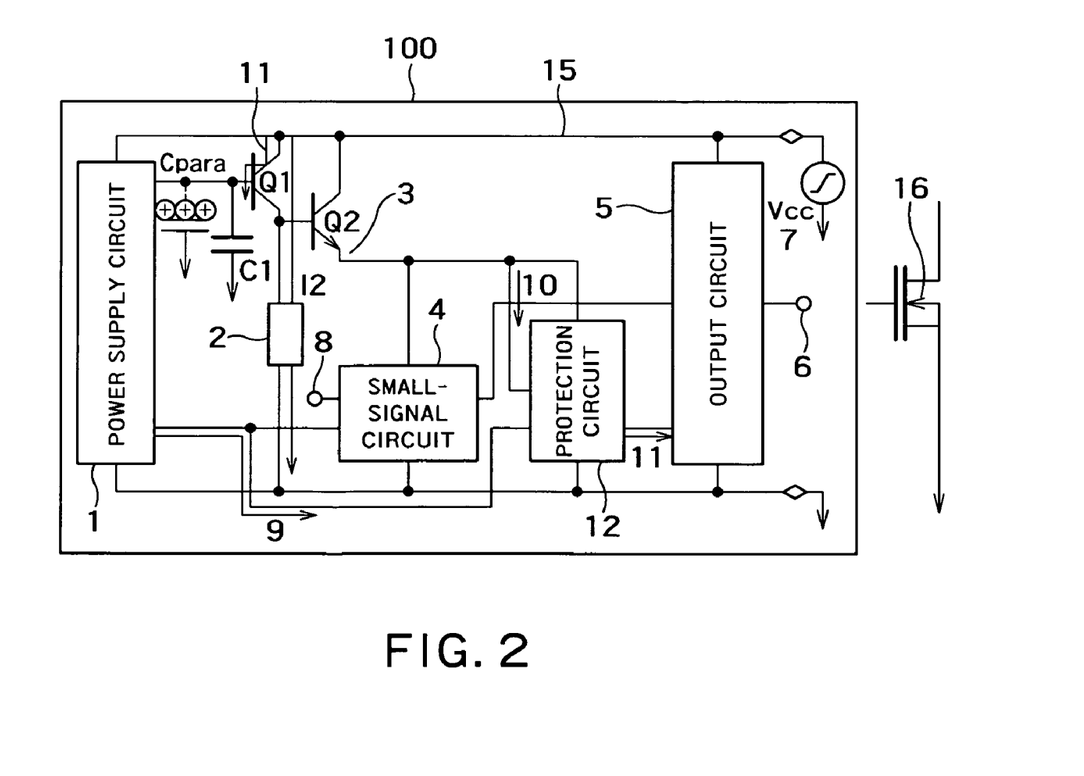
FIG. 2 is a circuit diagram showing a semiconductor integrated circuit according to a second embodiment of the present invention.

FIG. 2 is a circuit diagram showing a semiconductor integrated circuit according to this embodiment. In addition to the structures of the semiconductor integrated circuit 600 depicted in FIG. 1, this semiconductor integrated circuit 100 further has a capacitance C1 which is connected with a base terminal of a transistor Q1 in parallel with a parasitic capacitance. The capacitance C1 has one end being connected with the base of the transistor Q1 and the other end being grounded.

A capacitance component exits as just a parasitic capacitance at the base terminal of the transistor Q1 in a conventional semiconductor integrated circuit. In this embodiment, a state in which a displacement current I1 flows in when a supply power Vcc7 varies is generated by connecting the capacitance C1 with the base terminal in parallel with the parasitic capacitance. When the transistor Q1 is of an LPNP type, this displacement current I1 is multiplied by hFE to become I2 and flows into a current-voltage converter 2, thereby increasing a potential of a constant-voltage line 3. When an increased potential of the constant-voltage line 3 is not smaller than Vth or VBE of a transistor of a small-signal circuit 4, the small-signal circuit 4 enters an operating state. To the small-signal circuit 4 the potential is supplied from the constant-voltage line 3. The increased potential (V3) of the constant-voltage line 3 can be expressed by the following expression.

For example, when the current-voltage converter 2 is a resistor (R), the following expression can be achieved:

$$V3 (dVcc/dt)*(Cpara+C1)*hFE*R-V_{BE} \quad (1)$$

Addition of the capacitance C1 can assuredly increase the potential of the constant-voltage line 3 and allow a protection circuit 12 to enter an operation enabled state. Its condition can be provided by the following expression:

$$V3 > Vth1 \quad (2)$$

where Vth1 is a threshold of a supply voltage with which the protection circuit 12 operates.

Based on Expression (1), $$C1 > (Vth1+VBE)/(hFE*R)*1/(dVcc/dt)-Cpara \quad (3)$$

A condition under which the protection circuit 12 is assuredly operated can be given by Expression (3). When a para-sitic capacitance Cpara is hard to be measured, the capacitance C1 satisfying a condition of the following Expression (4) is used. Setting the capacitance C1 in this manner can suffice.

$$C1 > (Vth1+VBE)/(hFE*R)*1/(dVcc/dt) \quad (4)$$

The capacitance C1 may be a capacitance satisfying the condition of Expression (3) or a capacitance satisfying the condition of Expression (4).

Third Embodiment

A third embodiment will now be described with reference to FIG. 3.

Figure 3:
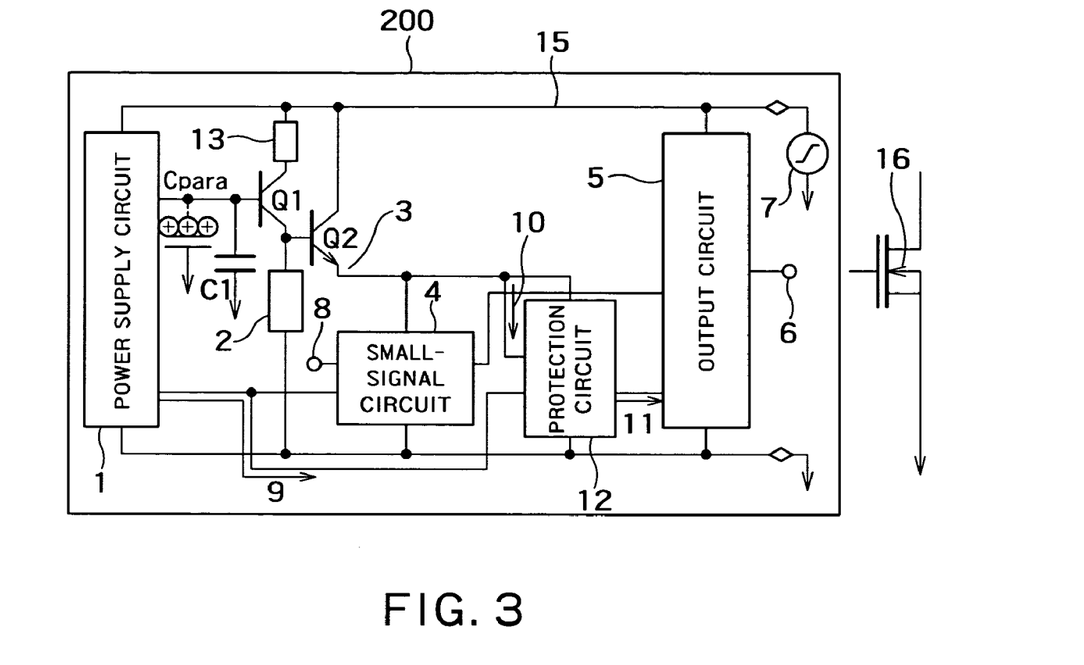
FIG. 3 is a circuit diagram showing a semiconductor integrated circuit according to a third embodiment of the present invention.

FIG. 3 is a circuit diagram showing a semiconductor integrated circuit according to this embodiment. In comparison to the semiconductor integrated circuit 100 shown in FIG. 2, this semiconductor integrated circuit 200 is characterized in having a resistor 13. The resistor 13 is inserted between a power supply line 15 and an emitter terminal of a transistor Q1. Moreover, an increase in a potential of a constant-voltage line 3 is determined by a time constant of this resistor 13 and a capacitance C1 (including a parasitic capacitance). Therefore, adjusting a value of the resistor 13 can control a further appropriate increase in a potential of the constant-voltage line 3.

As described above, when a supply voltage Vcc7 is precipitously increased and not greater than Vccth (when a power supply voltage is in an unoperated state), an output potential is not outputted from an output terminal 6 by a function of a protection circuit 12, thereby avoiding erroneous operation output. Additionally, when the power supply circuit 1 enters a steady state and a potential of the constant-voltage line 3 is increased to be not smaller than V3th, an output circuit 5 can be set in a regular operating state.

Fourth Embodiment

A fourth embodiment will now be described with reference to FIG. 4.

Figure 4:
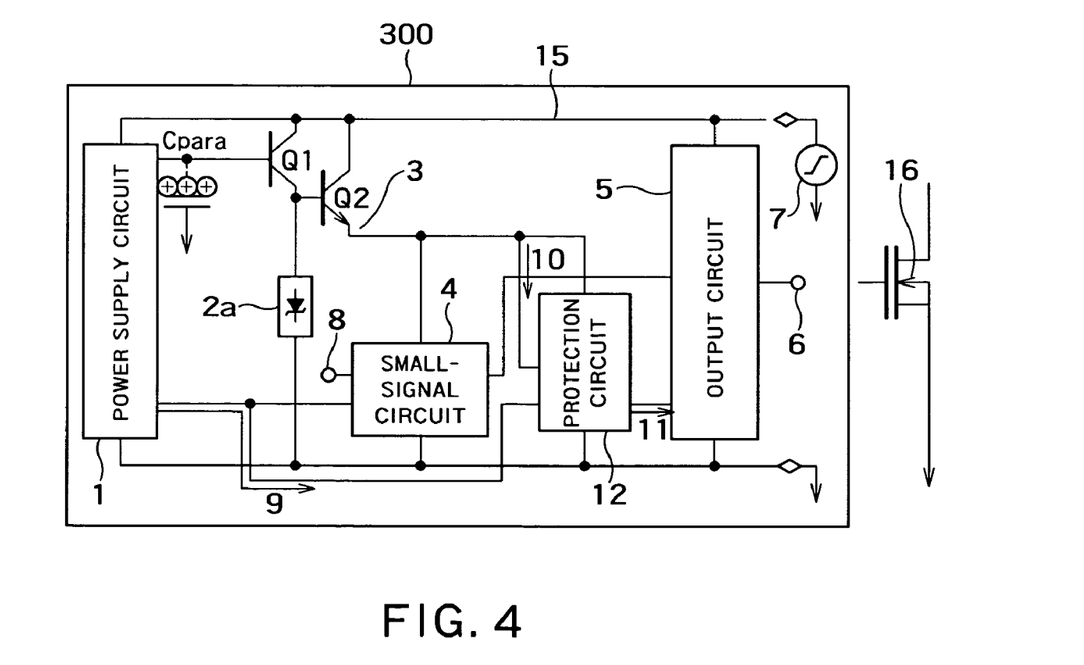
FIG. 4 is a circuit diagram showing a semiconductor integrated circuit according to a fourth embodiment of the present invention.

FIG. 4 is a circuit diagram showing a semiconductor integrated circuit according to this embodiment. In comparison to the semiconductor integrated circuit 100 shown in FIG. 2, this semiconductor integrated circuit 300 is characterized in that a capacitance C1 at a base terminal of a transistor Q1 is removed and a current-voltage converter 2a is constituted of a single zener diode. Connecting the capacitance C1 with the base terminal of the transistor Q1 increases a potential of the constant-voltage line 3 in the second embodiment. However, when the current-voltage converter 2a is constituted of, e.g., a single zener diode, a potential in an initial rise of the constant-voltage line 3 can be increased with a small rise in a supply power Vcc7. Therefore, the capacitance C1 can be eliminated, and the same effects as those in the second embodiment can be obtained.

As described above, when the supply voltage Vcc7 is precipitously increased and not greater than Vccth (when a power supply circuit 1 is in an unoperated state), an output potential is not outputted from an output terminal 6 by a function of a protection circuit 12, thereby avoiding erroneous operation output. Further, when the power supply circuit 1 enters a steady state and a potential of the constant-voltage line 3 is increased to be not smaller than V3th, an output circuit 5 can be set in a regular operating state.

Fifth Embodiment

A fifth embodiment will now be described with reference to FIG. 5.

Figure 5:
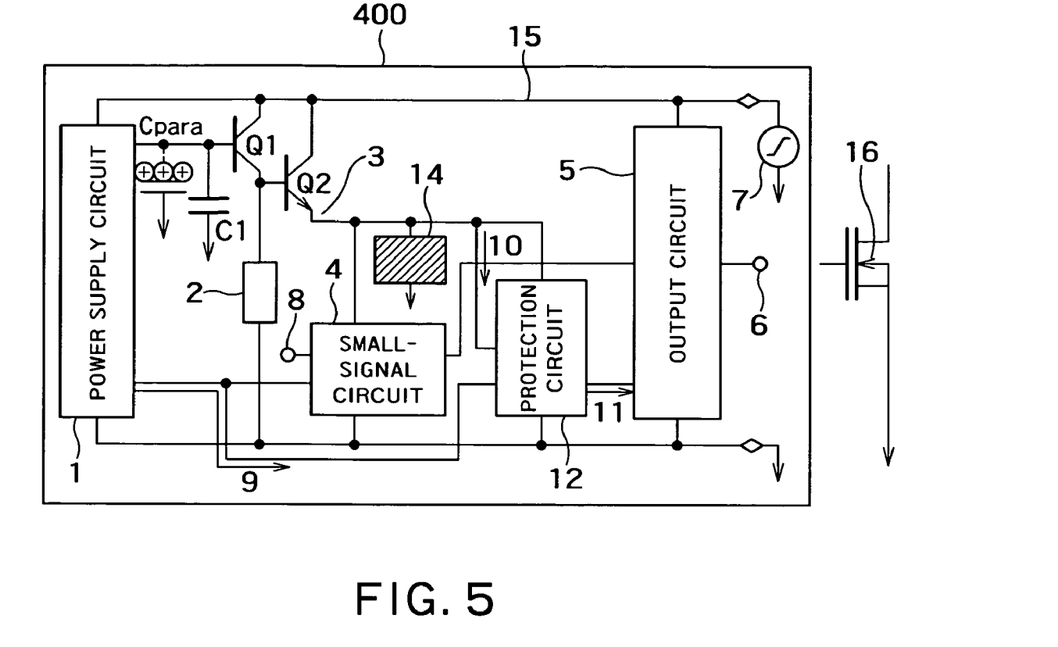
FIG. 5 is a circuit diagram showing a semiconductor integrated circuit according to a fifth embodiment of the present invention.

FIG. 5 is a circuit diagram showing a semiconductor integrated circuit according to this embodiment. In comparison to the semiconductor integrated circuit 100 shown in FIG. 2, this semiconductor integrated circuit 400 is characterized by having a clamping circuit 14. The clamping circuit 14 is inserted under a constant-voltage line 3.

The clamping circuit is a circuit which enters a conductive state when a potential which is not smaller than a given fixed value (i.e., a clamp voltage) is applied. Therefore, inserting the clamping circuit under a given constant-voltage line and setting a clamp voltage to a potential corresponding to a withstand voltage of an element provided below the constant-voltage line can allow the clamping circuit to enter a conductive state when a voltage corresponding to the clamp voltage is applied to the constant-voltage line, thereby protecting the element provided below the constant-voltage line from breakdown.

The semiconductor integrated circuit according to this embodiment can suppress an increase in a potential of the constant-voltage line 3 generated by a capacitor C1 at a base terminal of a transistor Q1 to become not greater than a withstand voltage of the element provided below the constant-voltage line 3 by using this function of the clamping circuit 14. The clamping circuit 14 can suppress the potential of the constant voltage to become not greater than the withstand voltage, thereby avoiding breakdown of the element.

As described above, when a supply voltage Vcc7 is precipitously increased and not greater than Vccth (when a power supply circuit 1 is in an unoperated state), an output potential is not outputted from an output terminal 6 by a function of a protection circuit 12, thereby avoiding erroneous operation output. Furthermore, when the power supply circuit 1 enters a steady state and a potential of the constant-voltage line 3 is increased to be not smaller than V3th, an output circuit 5 can be set in a regular operating state.

Sixth Embodiment

A sixth embodiment will now be described with reference to FIG. 6.

Figure 6:
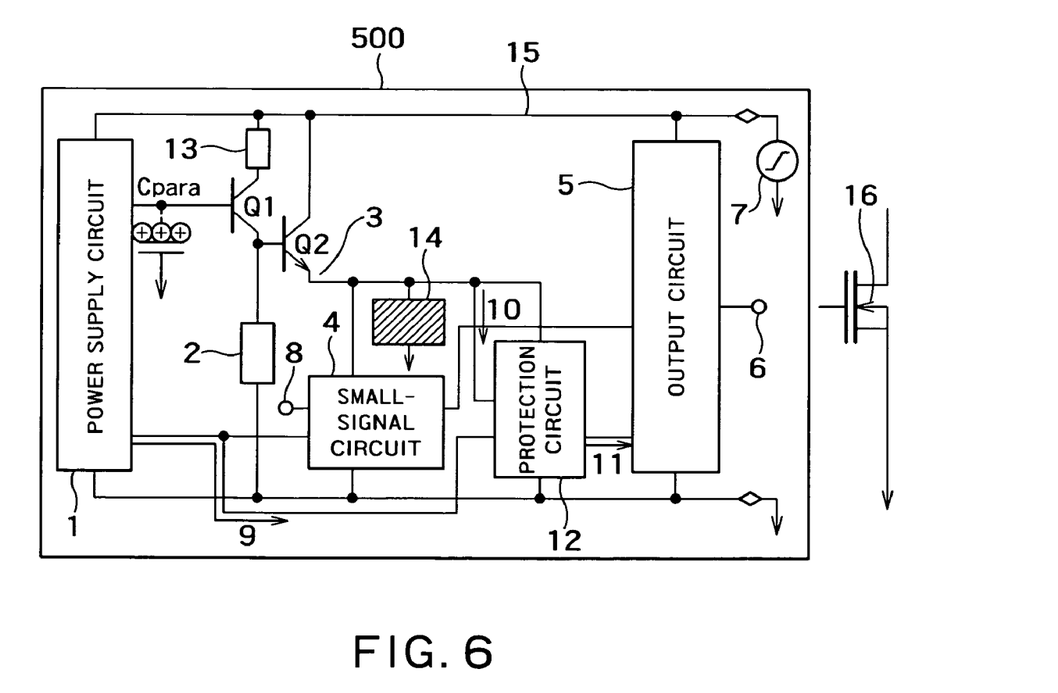
FIG. 6 is a circuit diagram showing a semiconductor integrated circuit according to a sixth embodiment of the present invention.

FIG. 6 is a circuit diagram showing a semiconductor integrated circuit according to this embodiment. In comparison the semiconductor integrated circuit 100 shown in FIG. 2, this integrated circuit 500 is characterized in that a capacitance C1 at a base terminal of a transistor Q1 is removed and this circuit has a clamping circuit 14. In this embodiment, when a potential of a constant-voltage line can be increased to become not smaller than Vth or VBE without using the additional capacitance C1, a parasitic capacitance alone can suffice.

The semiconductor integrated circuit 500 according to this embodiment can suppress an increase in a potential of the constant-voltage line 3 to be not greater than a withstand voltage of an element provided below the constant-voltage line by using the clamping circuit 14. Using the clamping circuit 14 can suppress the potential of the constant voltage to be not greater than the withstand voltage, thereby avoiding breakdown of the element.

As described above, when a supply voltage Vcc7 is precipitously increased and not greater than Vccth (when a power supply circuit 1 is in an unoperated state), an output potential is not outputted from an output terminal 6 by a function of a protection circuit 12, thus avoiding erroneous operation output. Moreover, when the power supply circuit 1 enters a steady state and a potential of the constant-voltage line 3 is increased to be not smaller than V3th, an output circuit 5 can be set in a regular operating state.

The semiconductor integrated circuit according to the present invention can be used in a light-sensitive integrated device of a photo coupler as a driving IC.

Although the above has described the embodiments according to the present invention, the present invention is not limited to the foregoing embodiments. The invention can be of course modified and carried out in many ways within the scope thereof. For example, providing the semiconductor integrated circuit with the clamping circuit has been described in conjunction with the fifth and sixth embodiments, but the present invention is not restricted thereto. The clamping circuit can also be provided in, e.g., the semiconductor integrated circuit 600 shown in FIG. 1 or the semiconductor integrated circuit 300 shown in FIG. 4.

What is claimed is:

1. A semiconductor integrated circuit comprising:
a power supply circuit;
a voltage-current conversion circuit connected with an output of the power supply circuit, the voltage-current conversion circuit having an output terminal;
a current-voltage conversion circuit connected with the output terminal of the voltage-current conversion circuit, the current-voltage conversion circuit having an output terminal;
first voltage line connected with the output terminal of the current-voltage conversion circuit;
an output circuit which has an output terminal to which an external element is connected at a rear stage thereof; and
a protection circuit which is connected to the first voltage line and the output circuit, receives a potential of the first voltage line and the output signal from the power supply circuit to control a potential of the output terminal, and prevents the external element from operating when an increase in the potential of the first voltage line is insufficient or the power supply voltage is not in a steady state,
a second voltage line which connects an external supply power to the power supply circuit, the voltage-current conversion circuit, the current-voltage conversion circuit and the output circuit,
wherein the power supply circuit, the current-voltage conversion circuit, the protection circuit and the output circuit are commonly grounded.

2. The semiconductor integrated circuit according to claim 1, further comprising a capacitance which is connected between the power supply voltage and the voltage-current conversion circuit,
wherein the voltage-current conversion circuit is constituted of a PNP transistor having a parasitic capacitance and the capacitance is connected with a base of the transistor in parallel with the parasitic capacitance of the transistor.

3. The semiconductor integrated circuit according to claim 1, further comprising a resistor which is connected with the output of the power supply circuit,
wherein the voltage-current conversion circuit is constituted of a PNP transistor and the resistor is connected between an emitter of the PNP transistor and the output of the power supply circuit.

4. The semiconductor integrated circuit according to claim 2, further comprising a resistor which is connected with the output of the power supply circuit,
wherein the resistor is connected between an emitter of the PNP transistor and the output of the power supply circuit.

5. The semiconductor integrated circuit according to claim 1, wherein the current-voltage conversion circuit is constituted of a zener diode.

6. The semiconductor integrated circuit according to claim 1, further comprising a clamping circuit which is connected between the first voltage line and the protection circuit.

7. The semiconductor integrated circuit according to claim 2, further comprising a clamping circuit which is connected between the first voltage line and the protection circuit.

8. The semiconductor integrated circuit according to claim 6, further comprising a resistor which is connected with the output of the power supply circuit,
wherein the voltage-current conversion circuit is constituted of a PNP transistor and the resistor is connected between an emitter of the PNP transistor and the output of the power supply circuit.

9. A controlling method of a semiconductor integrated circuit comprising a power supply circuit, a voltage-current conversion circuit, a current-voltage conversion circuit, a first and second voltage lines and an output circuit, the method comprising:
inputting an output of the power supply circuit with the voltage-current conversion circuit, the voltage-current conversion circuit having an output terminal;
connecting the first voltage conversion circuit with the output terminal of the voltage-current conversion circuit, the current-voltage conversion circuit having an output terminal;
connecting the first voltage line with the output terminal of the current-voltage conversion circuit; and
detecting a potential of the first voltage line and the output signal from the power supply circuit and controlling a potential of the output terminal of the output circuit to prevent an external element connected at a rear stage of the output circuit from operating when an increase in the potential of the first voltage line is insufficient for a normal operation of the external element or the power supply voltage is not in a steady state,
connecting the second voltage line to an external supply power and to the power supply circuit, the voltage-current conversion circuit, the current-voltage conversion circuit and the output circuit, and
grounding the power supply circuit, the current-voltage conversion circuit, the protection circuit and the output circuit in common.

10. The controlling method of a semiconductor integrated circuit according to claim 9,
wherein the voltage-current conversion circuit of the semiconductor integrated circuit is constituted of a PNP transistor having a parasitic capacitance and the controlling method further comprises connecting a capacitance with a base of the transistor in parallel with the parasitic capacitance of the transistor and supplying a displacement current to the transistor when the supply power source changes.

11. The controlling method of a semiconductor integrated circuit according to claim 9,
wherein the voltage-current conversion circuit of the semiconductor integrated circuit is constituted of a PNP transistor, and the semiconductor integrated circuit further comprises a resistor which is connected between an emitter of the PNP transistor and the output of the power supply circuit and the controlling method comprises adjusting a value of the resistor in such a manner that a potential of first voltage line is appropriately increased.

12. The controlling method of a semiconductor integrated circuit according to claim 10,
wherein the semiconductor integrated circuit further comprises a resistor which is connected between an emitter of the PNP transistor and the output of the power supply circuit and the controlling method comprises adjusting a value of the resistor in such a manner that a potential of the first voltage line is appropriately increased.

13. The controlling method of a semiconductor integrated circuit according to claim 9, further comprising suppressing a potential of the first voltage line to a potential not greater than a withstand voltage of the external element connected with a rear stage of the output terminal.

14. The controlling method of a semiconductor integrated circuit according to claim 10, further comprising suppressing a potential of the first voltage line to a potential not greater than a withstand voltage of the external element connected with a rear stage of the output terminal.

15. The controlling method of a semiconductor integrated circuit according to claim 13,
wherein the voltage-current conversion circuit of the semiconductor integrated circuit is constituted of a PNP transistor, and the semiconductor integrated circuit further comprises a resistor which is connected between an emitter of the PNP transistor and the output of the power supply circuit and the controlling method further comprises adjusting a value of the resistor in such a manner that a potential of the first voltage line is appropriately increased.

* * * * *